United States Patent [19]

Desphandey et al.

[11] Patent Number: 4,816,291

[45] Date of Patent: Mar. 28, 1989

[54] PROCESS FOR MAKING DIAMOND, DOPED DIAMOND, DIAMOND-CUBIC BORON NITRIDE COMPOSITE FILMS

[75] Inventors: Chandra V. Desphandey, Los Angeles; Rointan F. Bunshah, Playa del Ray; Hans J. Doerr, Simi Valley, all of Calif.

[73] Assignee: The Regents of the University of California, Berkeley, Calif.

[21] Appl. No.: 87,141

[22] Filed: Aug. 19, 1987

[51] Int. Cl.[4] .............................................. B05D 3/06
[52] U.S. Cl. ..................................................... 427/38
[58] Field of Search ..................................... 427/38, 39

[56] References Cited

U.S. PATENT DOCUMENTS 3,791,852  2/1974  Bunshah .
3,916,052  10/1975 Shattes et al. .
4,297,387  10/1981 Beale .
4,336,277  6/1982  Bunshah et al. .
4,412,899  11/1983 Beale .
4,415,420  11/1983 Beale .
4,416,912  11/1983 Bache .
4,436,830  3/1984  Andreev et al. .
4,452,686  6/1984  Axenov et al. .
4,486,286  12/1984 Lewin et al. .
4,495,044  1/1985  Banks ................................ 427/39 X
4,551,221  11/1985 Axenov et al. .
4,554,201  11/1985 Andreev et al. .
4,643,952  2/1987  Kurakata ........................... 427/38 X
4,655,893  4/1987  Beale .
4,656,052  4/1987  Satou et al. .

Primary Examiner—Bernard Pianalto
Attorney, Agent, or Firm—Poms, Smith, Lande & Rose

[57] ABSTRACT

A process and apparatus that may be used for the production of diamond and doped diamond films at high rates by activated reactive vapor deposition. Carbon is evaporated in a vacuum chamber in the presence of atomic hydrogen containing plasma to form diamond precursors which then deposit on a substrate located within the vacuum chamber.

19 Claims, 1 Drawing Sheet

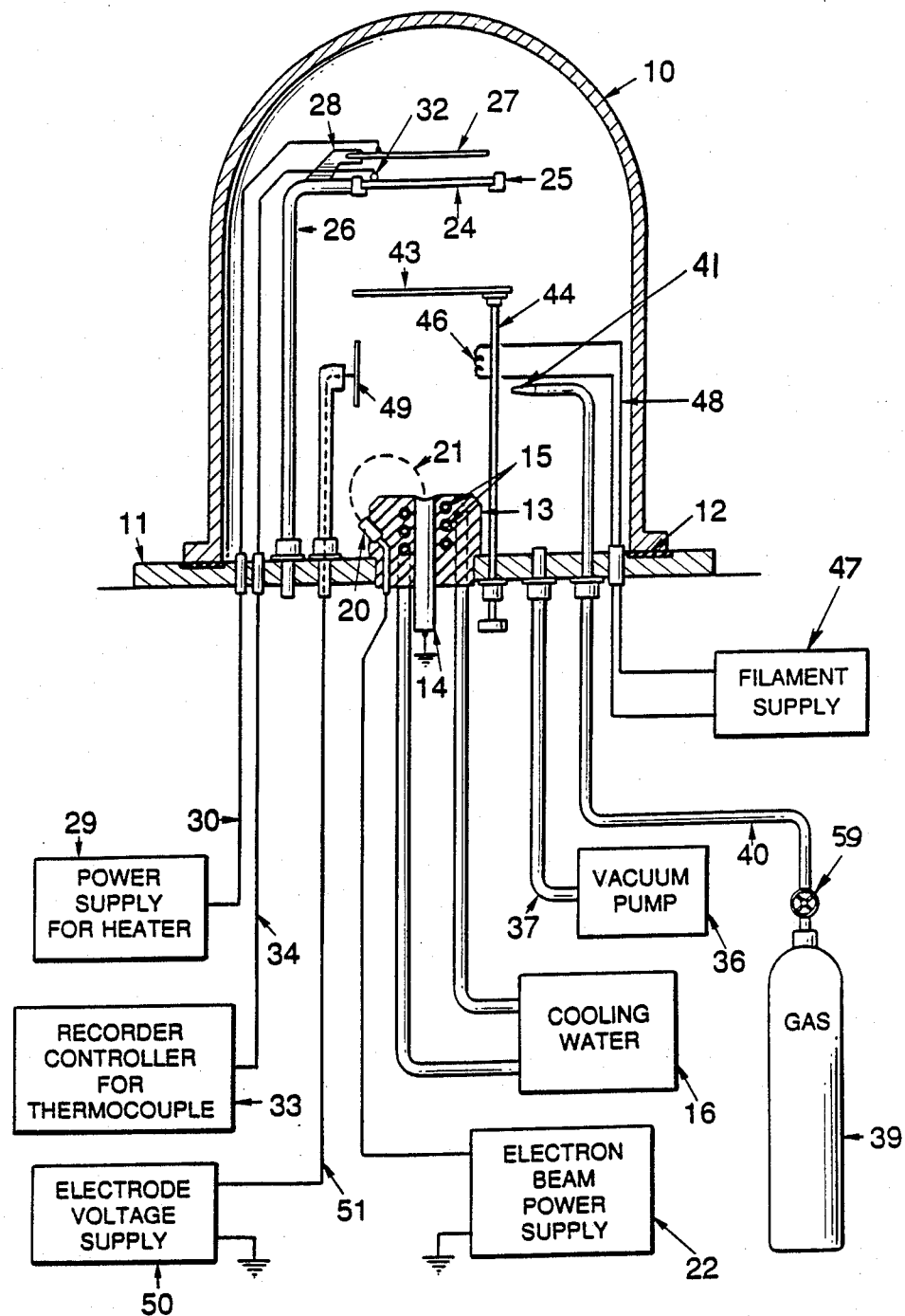

PROCESS FOR MAKING DIAMOND, DOPED DIAMOND, DIAMOND-CUBIC BORON NITRIDE COMPOSITE FILMS

BACKGROUND OF THE INVENTION

1. Field of the Invention

This invention relates to the process of depositing diamond, doped diamond and cubic boron nitride-diamond composite films. More specifically it relates to deposition of these films at high rates over large areas, based on Activated Reactive Evaporation (ARE) as first described in U.S. Pat. No. 3,791,852.

2. Description of the Background Art

The publications and other reference materials referred to herein to describe the background of the invention and to provide additional detail regarding its practice are hereby incorporated by reference. For convenience, the reference materials are numerically referenced and grouped in the appended bibliography.

Techniques used in recent years to deposit films of diamond-like carbon (i-C), diamond and boron nitride onto substrates have included chemical vapor deposition (CVD) and plasma assisted chemical vapor deposition (PACVD) involving plasma decomposition of hydrocarbon/boron containing gases. Ion beam assisted/enhanced deposition has also been used.

Diamond microcrystals were prepared using chemical vapor deposition and related techniques, at low pressures for the first time by Derjaguin and co-workers (1) by a chemical transport method. Subsequently Angus et al. (2) reported deposition of diamond onto natural diamond powder from methane gas at 1050° C. and 0.3 torr pressure. They also proposed a qualitative model explaining the kinetics of diamond growth from the vapor phase. More recently Matsumoto et al. (3,4), have reported synthesis of diamond microcrystals by chemical vapor deposition from a mixture of methane and hydrogen gas in open flow systems. They have shown that the growth of diamond films can be enhanced if a heated tungsten filament is used in the CVD set up. Spitsyn et al. (5) in their paper have discussed the kinetics of diamond growth from $CH_4+H_2$ gas mixtures. They have argued that atomic hydrogen plays a unique role in the growth of diamond from vapor phase.

Whitmell et al. (6) were the first to report the use of plasma decomposition techniques in the deposition of amorphous carbon-like films onto a negatively biased d.c. electrode using methane gas. However, the growth of films in their earlier experiment was thickness limited. This was believed to be due to the formation of an insulating film (i-C) on the surface of the d.c. biased electrode which after a critical thickness was reached, prevented the bombardment of the growing film with energetic ions from the plasma. Following that report, Holland (7) proposed a modification where an r.f. potential was applied to the electrode to achieve a constant film bombardment during growth. Using this technique Holland et al. (8,9) successfully deposited diamond-like carbon films on a variety of substrates. Over the years, many researchers have used similar processes (i.e. r.f. decomposition of hydrocarbon gas) to prepare diamond-like carbon films. (10,11) Similar techniques have been used to deposit BN films, where boron containing gases are used instead of hydrocarbon gases.

The remote plasma deposition technique developed by Lucovsky et al. (12) also falls under the category of a PACVD type process. In this process a mixture of reactive and inert gas is dissociated using r.f. excitation. The activated species, e.g., oxygen, from the plasma react down stream with the process gas such as $SiH_4$ (for $SiO_2$ deposition) to form complexes such as $H_3Si-O-SiH_3$ in the gas phase which subsequently condense on the substrate. Bombardment by energetic neutrals dissociate the complex to produce the compound films. This technique has been successfully used by Richard et al. (13) to prepare $SiO_2$, $Si_3N_4$ at low deposition temperatures. They have proposed to extend this technique to the deposition of diamond by using $CH_4$ as a process gas and $H_2$ or a $H_2+He$ gas mixture for activation.

Aisenberg and Chabot (14) were the first to report deposition of diamond-like carbon films by ion-beam deposition of carbon. Attempts to deposit similar films using magnetron sputtering and r.f. sputtering were only partially successful. It is likely that negligible substrate bombardment in the case of magnetron sputtering and substrate overheating in case of r.f. sputtering may have restricted the formation of i-C films in the above two techniques.

However, the dual ion beam technique used by Weissmantel (15,16) has proved to be quite successful in synthesis of diamond-like carbon films. He used a primary beam to deposit carbon with the growing film being simultaneously bombarded by $Ar^+$ ions generated from the second ion source. Weissmantel has successfully used this technique to deposit i-C, i-BN as well as i-C/i-BN composite coatings.

In plasma decomposition techniques, the rate of deposition of the carbon films critically depends on the rate of dissociation of the hydrocarbon gas. To increase the dissociation rate, one has to increase the gas pressure and/or the r.f. power used to excite the plasma. However, the increase in r.f. power also increases the energy of the bombarding species. Moreover, increased dissociation of hydrocarbon gas produces a greater amount of hydrogen that can be trapped into the growing films—thereby producing excessive stress in the film.

A modification has been suggested where independent sources are used, one to dissociate the hydrocarbon gas, and the other for film bombardment. One such modification is due to Nyaiesh et al. (17) who have used separate r.f. sources, one to dissociate the hydrocarbon gas and the other for substrate biasing which in turn controls the bombardment of growing film. Though this technique has shown some improvement in deposition rate, the authors note that the substrate bias was affected by the power applied to the r.f. oven. Moreover, they report that input power to the r.f. oven was limited due to deposits formed by polymerization onto the chamber walls, which reduced the deposition rate.

Another approach is proposed by Kamo et al. (18), Saito et al. (19), and also by Doi et al. (20,21), where a microwave discharge is used to decompose the hydrogen gas and an independent r.f. source is used for substrate biasing. These authors have reported deposition of i-C, diamond and boron doped diamond films using this technique. However, this technique does not appear to be much different than that of Nyaiesh et al. (17) and would therefore suffer from similar limitations. In fact, the optimum deposition rate reported by Doi et al. (21) is about 1 um/hr. which seems to be very low. Moreover, even with the above-proposed modifications, it is not possible to control the hydrogen content of the films independently of the other process variables.

Although the ion beam technique provides advantages as regards independent control of substrate bombardment, deposition rate and hydrogen content, it suffers from the following two major limitations: (1) low deposition rates due to the low sputtering yield of carbon; and (2) limitations for large area deposition due to limitations in the available sizes of the ion sources.

Strel'nitskii et al. (23) have reported deposition of i-C films using energetic C+ ions from an arc source.

As is apparent from the above background, there presently is a continuing need to provide improved processes for depositing diamond and diamond-like films on substrates. Such improved processes should be able to provide control over the rate of generation of reaction vapors e.g. C, B, etc. independently of other process parameters. The process should also provide control over the plasma volume chemistry independent of the other process variables and provide control over the film bombardment independent of the other process variables. These attributes in such a process will make it possible to deposit diamond, doped diamond and cubic boron nitride-diamond films at higher rates and over large areas.

SUMMARY OF THE INVENTION

This invention provides an improved method of synthesis of diamond films on a suitable substrate using plasma assisted physical vapor deposition techniques. The method is based on controlling the plasma chemistry in the reaction zone between the source of carbon and the substrate.

Graphite or other material used as a source for carbon is vaporized in the vacuum chamber using an electron beam, or cathodic arc to provide carbon vapors in the reaction zone. Hydrogen containing gas is introduced into the reaction zone. Gas activation as well as carbon vapor activation is achieved using a filament/anode geometry, where electrons emitted thermionically from a heated tungsten filament are accelerated towards a positively biased electrode. It is believed that the atomic hydrogen produced by electron collision with molecular hydrogen plays a crucial role in synthesis of the diamond. Atomic hydrogen thus produced enhances the evaporation rate of carbon by producing volatile carbon-hydrogen complexes at the surface of the carbon evaporation source. This reaction is stimulated by the electrons bombarding or near to the carbon source. Collision between atomic hydrogen and the evaporated carbon and/or carbon-hydrogen molecules is believed to produce molecular precursors which are responsible for the synthesis and depositing of diamond films on the substrate.

The microstructure of the diamond deposit and therefore its physical and mechanical properties can be varied by changing substrate temperature and substrate bombardment. An important advantage of the above process results from its ability to control the plasma volume chemistry independent of the source and substrate reactions. This makes it possible to obtain high deposition rates and also better control over the film properties.

The above-discussed and many other features and attendant advantages of the present invention will become apparent as the invention becomes better understood by reference to the following detailed description when considered in conjunction with the accompanying drawings.

BRIEF DESCRIPTION OF THE DRAWING

The single FIGURE of the drawing is a schematic vertical sectional view of a vacuum chamber and associated equipment suitable for performing the process of the invention and incorporating the presently preferred embodiment of the apparatus of the invention.

DESCRIPTION OF THE PREFERRED EMBODIMENTS

The preferred apparatus for carrying out the process of the present invention is a modification of the apparatus disclosed in U.S. Pat. No. 3,791,852, for carrying out Activated Reactive Evaporation (ARE) and the apparatus described by Chopra et al. (22) for carrying out Activated Dissociation Reduction Reaction processes, the contents of which are hereby incorporated by reference. The apparatus includes a vacuum chamber which may comprise a conventional cover or dome 10 resting on a base 11 with a sealing gasket 12 at the lower rim of the cover 10. A support and feed unit 13 for a source carbon rod used for evaporation 14 may be mounted in the base 11. The unit 13 includes a mechanism (not shown) for moving the carbon rod 14 upward at a controlled rate. Cooling coils 15 may be mounted in the unit 13 and supplied with cooling water from a cooling water source, 16. An electron gun 20 is mounted in unit 13 and provides an electron beam along the path 21 to the upper surface of the carbon rod 14, with the electron gun being energized from a power supply 22.

A substrate 24 on which the diamond film is to be deposited, is supported in a frame 25 on a rod 26 projecting upward from the base 10. The substrate 24 may be heated by an electric resistance heater 27 supported on a bracket 28. Energy for the heater 27 is provided from a power supply 29 via a cable 30. The temperature of the substrate 24 is maintained at a desired value by means of a thermocouple 32 in contact with the upper surface of the substrate 24, with the thermocouple connected to a controller 33 by line 34, with the controller output signal regulating the power from the supply 29 to the heater 27.

The desired low pressure is maintained within the vacuum chamber by a vacuum pump 36 connected to the interior of the chamber via a line 37. Gas from a gas supply 39 is introduced into the zone between the carbon rod 14 and substrate 24 via a line 40 and nozzle 41. A shutter 43 is mounted on a rod 44 which is manually rotable to move the shutter into and out of position between the carbon rod 14 and substrate 24.

A tungsten filament 46 is supported from the base 11 in the reaction zone between the source 14 and the substrate 24. The filament 46 is thermionically heated using a supply 47 via line 48. An anode, typically a metal plate 49, is supported from base 11 opposite to the filament 46. An electric potential is provided for the anode 49 from a voltage supply 50 via line 51.

Various components utilized in the apparatus described above are conventional. The evaporation chamber 10 is preferably a 24 inch diameter and 35 inch high water cooled stainless steel bell jar. The vacuum pump is preferably a 10 inch diameter fractionating diffusion pump, with an anti-migration type liquid nitrogen trap. The source carbon unit 13 is preferably 1 inch diameter rod fed electron beam gun, self-accelerated 270° deflection type, such as Airco Temescal Model RIH-270. The power supply 22 is preferably an Airco Temescal Model CV30 30kW unit which may be operated at a constant voltage such as 10 kilovolts, with a variable emission current.

Various sizes and shapes of substrates can be utilized. Various substrates such as stainless steel, molybdenum, glass, quartz, silicon etc. have been used. In a preferred embodiment, the substrate is based about 8" above the surface of the carbon source 14. The heater 27 may be a 4 kilowatt tungsten resistance heater providing for heating the substrate to 700° C. and higher. Temperatures in the range of 600° to 1000° C. are preferred. The reactions that produce molecular precursors required for synthesis of diamond film take place primarily in the vapor phase in the reaction zone and/or on the surface of the carbon evaporation source. These reactions are independent of substrate temperature. However, as discussed below the properties and structure of the film is dependent on substrate temperature and bombardment.

The source of carbon may be a solid rod or billet. For the feed unit mentioned above, the rod is 0.975 inches diameter and 6" long. Appropriate alloys can be used to obtain p or n type doping in the films. An arc source can also be used to provide carbon vapors.

Hydrogen gas which dissociates to form atomic hydrogen is introduced via a series of needle valves.

The preferred range of pressure is $2 \times 10^{-4}$ to $20 \times 10^{-3}$ torr. In addition to hydrogen, hydrocarbon gases such as methane, ethane, etc. can be used to provide atomic hydrogen and the molecular fragments necessary for diamond growth. Mixtures of the above gases with hydrogen are also used. Additionally, argon has also been used with hydrogen and/or hydrocarbon gases to enhance the plasma volume chemistry in the region between the source and the substrate and to increase the density of precursors necessary for the growth of diamond films.

The filament 46 provides electrons for dissociating and ionizing the gases and the evaporated carbon vapor. The filament 46 is thermionically heated using a d.c. supply 47. A.C. can also be used for heating the filament. The electrons emitted from the heated filament 46 are accelerated to an anode 49, to which a d.c. potential is applied from a d.c. supply 50. The usual potential is in the range of about 80 volts, however higher voltages may be used if desired, by using a R.F. plasma Therm d.c. power supply. An a.c. potential as well as r.f. excitation with effective d.c. bias in similar voltage range has also been used.

As examples diamond films can be produced by using the above apparatus utilizing carbon evaporation in $H_2$, $CH_4$, $H_2+CH_4$, $H_2+Ar$, $H_2+Ar+CH_4$ gases and gas mixtures.

Doped diamond films are also possible. Boron is an excellent p-type dopant for diamond. For n-type doping Al and Li can be used. Boron doped films can be prepared by evaporating carbon in a plasma of $Ar+CH_4$ (or $Ar+CH_4+H_2$ or any other hydrocarbon gas preferably with $SP_3$ bonding) and boron containing gas such as $B_2H_6$. For aluminum doping, metal-organic compounds such as trimethyl aluminum vapors can be used. For lithium doping, Li can be co-evaporated with carbon in $Ar+CH_4$ plasma. Cubic boron nitride (CBN)-diamond composite films can be prepared by co-evaporating Boric acid/boric oxide and carbon in $CH_4+N_2/CH_4+H_2$ plasma. The possible reactions leading to the formation of the CBN-diamond composite films are:

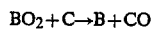

$$BO_2 + C \rightarrow B + CO$$

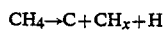

$$CH_4 \rightarrow C + CH_x + H$$

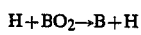

$$H + BO_2 \rightarrow B + H$$

$$B + N \rightarrow BN$$

$$C + C + H \rightarrow C - C + H$$

$$CH_x + CH_x + H \rightarrow C - C + H$$

The above are a few of the likely reactions. In addition, a variety of other reactions can take place depending on the energy, concentration and nature of the reactive species (excited, ionized, etc.) in the plasma volume. Glow discharge optical spectroscopy can be used to study the plasma chemistry and optimize plasma conditions to obtain CBN-diamond films.

An example of practice is as follows. The vacuum chamber was initially pumped down to $10^{-6}$ torr pressure and then purged with inert gas to $10^{-4}$ torr for a few times. The chamber was again pumped down to $10^{-6}$ torr. This procedure was used to minimize the presence of extraneous gases.

When pressure in the chamber was again down to $10^{-6}$ torr, the filament 46 was slowly heated to the desired temperature of about 1000° C. One of the above gases was then introduced in the vacuum chamber at a controlled rate to obtain a desired pressure. Pressure ranged from $2 \times 10^{-2}$ torr to about $1 \times 10^{-3}$ torr. Anode potential was then applied to obtain required anode current. The electron beam was turned on to heat the upper end of the carbon rod 14. The shutter 43 was in position blocking the substrate 24. When steady state conditions were obtained, the shutter 43 was moved to one side and films were deposited on the substrate 24. The process was continued until the desired thickness of film was obtained after which the shutter 43 was moved to the blocking position and the various supplies were turned off.

The gas pressure within the chamber, the anode potential and electron beam current required to produce the diamond films are interrelated and may be varied over a substantial range. With higher electron beam currents it is required to increase the partial pressure of hydrogen gas and the anode potential to obtain desired films. For example, successful formation of diamond films can be achieved in the range of 600 watts $-1.5$ kw with gas partial pressure in the range of $10^{-3}$ to $2 \times 10^{-2}$ torr.

$H_2$, $CH_4$, $H_2+CH_4$, $Ar+CH_4$, $Ar+H_2+CH_4$ gases have been used. Use of hydrocarbon gas such as $CH_4$ and its mixture with $H_2$ and/or Ar enhance the electron-molecular reactions producing appropriate precursors necessary for growth of diamond films.

The acts of precursor formation and deposit growth are separate steps in this process. The character of the deposit changes with substrate temperature and bombardment. For given conditions the deposit transforms from transparent/insulating type to absorbent/conducting type back to transparent/insulating type with increasing substrate temperature. The above transformation corresponds to the formation of diamond-like i-C films, graphitic films, diamond films, respectively. At low substrate temperature, the film growth is essentially controlled by the reaction occurring in the region between the source and the substrate.

As the temperature of the substrate increases beyond a critical value, substrate reactions also comes into play. At this temperature the condensing species tend to nucleate into graphitic structure. When the temperature is further increased a point is reached beyond which transparent diamond films can be formed. It is believed that the condensation of the graphitic phase in this temperature range is prevented by the competitive process of etching of graphite by atomic hydrogen since the etching rate increases with temperature.

It has been found that the film properties can be controlled by changing the partial pressure of reactive gas, evaporation rate and substrate temperature/bombardment. As an example, with a carbon evaporation rate of 0.2 gms/min and a hydrogen partial pressure of 10 millitorr, transparent and insulating films of diamond are deposited at a rate of 3 um/hr at source-to-substrate distance of 8". Higher deposition rates could be achieved by adjusting the electron beam current and $H_2$ partial pressure appropriately or decreasing the source to substrate distance. Higher or lower rates may be obtained by varying the process parameters of the system. The carbon evaporation rate may be controlled by varying output of electron gun 20 and gas pressure may be controlled by adjusting a valve 59 in the gas line 40.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

BIBLIOGRAPHY

1. B. V. Derjaguin, D. V. Fedoseev, V. M. Lykualiovich, B. V. Spitsyn, V. A. Ryanov and A. V. Lavreutyev, J. Cryst. Growth 2, 380, 1968.
2. J. C. Angus, H. A. Will and W. S. Steinko, J. Apl. Phys. 39(6), 2915, 1968.
3. S. Matsumoto, Y. Saito, M. Kano and N. Setaka, Jap. J. Appl. Phys., 21, L183, 1982.
4. S. Matsumoto, Y. Saito, M. Tsutsumi and N. Setaka, Jour. Mater. Sci. 17, 3106, 1982.
5. B. V. Spitsyn, B. V. Derjaguin, L. L. Builov, A. A. Klochkov, A. E. Gorodetskii and A. V. Smoi'yanihov, Sov. Phys. Dokl, 21 676, 1976.
6. D. S. Whitmell and R. W. Williamson, Thin Solid Films, 35, 255, 1976.
7. L. Holland, U. K. Patent No. 1582231, August 76.
8. L. Holland and S. M. Ojha, Thin Solid Films, 38, L17, 1976.
9. L. Holland and S. M. Ojha, Thin Solid Films, 48, L21, 1978. Also L. Holland and S. M. Ojha, Thin Solid Films, 58, 107, 1979.
10. H. Vora and T. J. Moravac, J. Appl. Phys., 52, 6151, 1981.
11. L. P. Anderson, S. Berg, H. Norstrom and S. Towa, Thin Solid Films, 63, 155, 1978.
12. G. Lucovsky, P. D. Richards and R. J. Markura, paper presented at workshop of Dielectric Systems for III-V Semiconductors, San Diego, Calif., May 26-27, 1984.
13. P. D. Richard, R. J. Markunas, G. Lucovsky, G. G. Fountain, A. N. Mansour and D. V. Tsu, J. Vac. Sci. Technology, J. Vac. Sci. Technol. A3(3), 867, 1985.
14. S. Ainsberg and R. Chabot, J. Appl. Phys. 42, 2953, 1971.
15. C. Weissmantel, Thin Solid Films, 35, 255, 1976.
16. C. Weissmantel, K. Breuer and B. Winde, Thin Solid Films, 100, 383, 1983.
17. A. R. Nyaiesh, R. E. Kirby, F. K. King and E. L. Garwin, J. Vac. Sci. Technol. A3(3), 610, 1985.
18. M. Kamo, Y. Sato, M. Matsumoto and N. Setaka, J. Cryst. Growth, 62, 642, 1983.
19. Y. Saito, S. Matsuda and S. Nogita, Mat. Sci. Letter, 3, 565, 1986.
20. A. Doi, N. Fujimon and T. Yoshioka, Proc. Intt. Ion Energy Congress. p. 1137, Institute of Electronic Engineering of Japan, Tokyo, 1983.
21. N. Fujimori, T. Imai and A. Doi, Vacuum 36, 99, 1986.
22. K. L. Chopra, V. Agarwa, V. D. Vankar, C. V. Deshpandey and R. F. Bunshah, Thin Solid Films, 126, 307, 1985.
23. V. E. Strel'nitskii, V. G. Padalka and S. I. Vakula, Sov. Phys. Tech. Phys. 23(2), 222, 1978.

What is claimed is:

1. A process for depositing films comprising diamond on a substrate, said process comprising the steps of:
supporting a substrate in a vacuum;
evaporating a source of carbon to produce a carbon vapor in a zone between the source of carbon and the substrate;
introducing a hydrogen containing gas into said zone;
accelerating electrons from an electron source into said zone to ionize said carbon vapor and hydrogen containing gas to form carbon-hydrogen complex precursor molecules in said zone,
depositing said precursor molecules from said zone onto said substrate; and
maintaining said substrate at a temperature sufficient to dissociate said deposited precursor molecules to form said film comprising diamond.

2. A diamond deposition process according to claim 1 wherein said source of carbon is graphite.

3. A diamond deposition process according to claim 2 wherein said graphite is evaporated by an electron beam.

4. A diamond deposition process according to claim 1 wherein said hydrogen containing gas is selected from the group consisting of hydrogen, methane ethane and other hydrocarbon gases.

5. A diamond deposition process according to claim 4 wherein said hydrogen containing gas is a mixture of hydrogen and hydrocarbon gases or a mixture of hydrogen and argon or a mixture of hydrogen, argon and hydrocarbon gases.

6. A diamond deposition process according to claim 1 wherein said substrate is selected from the group consisting of stainless steel, molybdenum, glass, quartz, silicon and aluminum.

7. A diamond deposition process according to claim 1 wherein the temperature of said substrate is maintained at temperatures of between about 600° C. and 1000° C.

8. A diamond deposition process according to claim 1 wherein the partial pressure of said hydrogen containing gas is between about $2 \times 10^{-4}$ torr and $20 \times 10^{-3}$ torr.

9. A diamond deposition process according to claim 8 wherein said hydrogen containing gas is hydrogen.

10. A diamond deposition process according to claim 1 wherein the electrons which are deflected into said zone are produced by said electron source comprising a heated filament.

11. A diamond deposition process according to claim 10 wherein said filament is tungsten, tantalum, molybdenium or carbon.

12. A diamond deposition process according to claim 1 wherein said electrons are deflected into said zone by accelerating said electrons toward an anode.

13. A diamond deposition process according to claim 10 wherein the electrons generated by said filament are accelerated through said zone toward an anode.

14. A diamond deposition process according to claim 13 wherein the potential at said anode is about 80 volts.

15. A diamond deposition process according to claim 1 wherein said film is doped with p and n type dopants such as aluminum, lithium or boron.

16. A deposition process according to claim 1 wherein a film comprising diamond cubic boron nitride is deposited.

17. A diamond deposition process according to claim 15 wherein a boron containing gas is introduced into said zone to provide a film comprising boron doped diamond.

18. A diamond deposition process according to claim 15 wherein vapor of metal organic compounds such as trimethyl aluminum are introduced into said zone to provide a film comprising aluminum doped diamond.

19. A diamond deposition process according to claim 1 wherein said hydrogen containing gas contains $CH_4$, nitrogen and hydrogen and boric acid/boric oxide is co-evaporated with said carbon to thereby form a film comprising cubic boron nitride doped diamond.

* * * * *

UNITED STATES PATENT AND TRADEMARK OFFICE
CERTIFICATE OF CORRECTION

PATENT NO. : 4,816,291

DATED : March 28, 1989

INVENTOR(S) : Chandra V. Deshpandey, Rointan F. Bunshah, and Hans J. Doerr

It is certified that error appears in the above-identified patent and that said Letters Patent is hereby corrected as shown below:

On the title page, item [75]:
The first inventor's last name is changed from "Desphandey" to --Deshpandey--.

Signed and Sealed this

Fifth Day of March, 1991

Attest:

HARRY F. MANBECK, JR.

Attesting Officer

Commissioner of Patents and Trademarks